US 11,715,946 B2

United States Patent
Guan et al.

(10) Patent No.: US 11,715,946 B2
(45) Date of Patent: Aug. 1, 2023

(54) ELECTRONIC DEVICE AND ELECTROSTATIC DISCHARGE PROTECTION CIRCUIT

(71) Applicant: INNOSCIENCE (SUZHOU) SEMICONDUCTOR CO., LTD., Suzhou (CN)

(72) Inventors: Yaobin Guan, Zhuhai (CN); Jianjian Sheng, Zhuhai (CN); Zhenzhe Li, Zhuhai (CN); Junyuan Lv, Zhuhai (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 290 days.

(21) Appl. No.: 17/252,286

(22) PCT Filed: Nov. 30, 2020

(86) PCT No.: PCT/CN2020/132730
§ 371 (c)(1),
(2) Date: Dec. 15, 2020

(87) PCT Pub. No.: WO2022/110133
PCT Pub. Date: Jun. 2, 2022

(65) Prior Publication Data
US 2022/0376494 A1 Nov. 24, 2022

(51) Int. Cl.
*H02H 9/04* (2006.01)
(52) U.S. Cl.
CPC .................. *H02H 9/046* (2013.01)
(58) Field of Classification Search
CPC ..................... H02H 9/046; H01L 27/0248
(Continued)

(56) References Cited

U.S. PATENT DOCUMENTS

| 6,388,850 B1* | 5/2002 | Ker | H02H 9/046 |
| | | | 361/56 |
| 10,381,828 B1 | 8/2019 | Knoedgen et al. | |
| 11,411,396 B2* | 8/2022 | Jiang | H02H 9/046 |
| 2008/0062595 A1* | 3/2008 | Ping | H02H 9/046 |
| | | | 361/56 |

(Continued)

FOREIGN PATENT DOCUMENTS

| CN | 103219720 A * | 7/2013 | ............. H02H 9/046 |
| CN | 103378071 A | 10/2013 | |

(Continued)

OTHER PUBLICATIONS

First Office Action of the corresponding China patent application No. 202080005212.2 dated Mar. 17, 2022.

(Continued)

*Primary Examiner* — Dharti H Patel
(74) *Attorney, Agent, or Firm* — McCoy Russell LLP (57) ABSTRACT

An electronic device includes a first group III nitride transistor and an electrostatic discharge (ESD) protection circuit. an electronic device may include a first group III nitride transistor and an ESD protection circuit. The ESD protection circuit may include a first transistor, a second transistor, and a third transistor. The first transistor may have a source and a gate connected to each other and electrically connected to a gate of the first group III nitride transistor. The second transistor may have a source and a gate connected to each other and electrically connected to a source of the first group III nitride transistor. The third transistor may have a drain electrically connected to the gate of the first group III nitride transistor, a gate electrically connected to a drain of the first transistor and to a drain of the second transistor, and a source electrically connected to the source of the first group III nitride transistor.

18 Claims, 7 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2012/0236449 A1 | 9/2012 | Ping et al. | |
| 2014/0063663 A1* | 3/2014 | Altolaguirre | H02H 9/046 361/56 |
| 2014/0334048 A1* | 11/2014 | Muhonen | H02H 9/046 361/56 |
| 2016/0372920 A1* | 12/2016 | Kinzer | H01L 27/0266 |
| 2018/0026029 A1* | 1/2018 | Lin | H01L 28/20 361/56 |
| 2018/0190639 A1 | 7/2018 | Hill | |
| 2019/0237967 A1* | 8/2019 | Knoedgen | H01L 27/0266 |
| 2020/0365581 A1 | 11/2020 | Guan et al. | |

FOREIGN PATENT DOCUMENTS

| | | | | |
|---|---|---|---|---|
| CN | 108321781 A | | 7/2018 | |
| CN | 109193601 A | | 1/2019 | |
| CN | 110098184 A | * | 8/2019 | ............ H01L 22/14 |
| CN | 110649915 A | * | 1/2020 | ............ H01L 23/60 |
| CN | 112740498 A | * | 4/2021 | ............ H02H 9/046 |

OTHER PUBLICATIONS

Jihua Li et al., "Device and Method for Testing Semiconductor Devices", U.S. Appl. No. 16/981,704, filed Sep. 17, 2020.
Second Office Action of the corresponding China patent application No. 202080005212.2 dated Jun. 21, 2022.
International Search Report and Written Opinion of the corresponding PCT application No. PCT/CN2020/132730 dated Jul. 22, 2021.

* cited by examiner

ELECTRONIC DEVICE AND ELECTROSTATIC DISCHARGE PROTECTION CIRCUIT

BACKGROUND

1. Field of the Disclosure

The disclosure relates to an electronic device having an electrostatic discharge (ESD) protection circuit, and particularly to a group III-V electronic device having an ESD protection circuit.

2. Description of the Related Art

Components including direct bandgap semiconductors, such as, for example, semiconductor components including group III-V materials or group III-V compounds (Category: III-V compounds) can operate or work under a variety of conditions or in a variety of environments (e.g., at different voltages and frequencies) due to their diverse characteristics.

Such semiconductor components may include a heterojunction bipolar transistor (HBT), a heterojunction field effect transistor (HFET), a high-electron-mobility transistor (HEMT), a modulation-doped FET (MODFET), or the like.

SUMMARY

In some embodiments, an electronic device may include a first group III nitride transistor and an electrostatic discharge (ESD) protection circuit. The ESD protection circuit may include a first transistor, a second transistor, and a third transistor. The first transistor may have a source and a gate connected to each other and electrically connected to a gate of the first group III nitride transistor. The second transistor may have a source and a gate connected to each other and electrically connected to a source of the first group III nitride transistor. The third transistor may have a drain electrically connected to the gate of the first group III nitride transistor, a gate electrically connected to a drain of the first transistor and to a drain of the second transistor, and a source electrically connected to the source of the first group III nitride transistor.

In some embodiments, an electronic device may include a first group III nitride transistor and an ESD protection circuit. The ESD protection circuit may include a first diode, a second diode, and a first transistor. The first diode may have an anode electrically connected to a gate of the first group III nitride transistor. The second diode may have an anode electrically connected to a source of the first group III nitride transistor. The first transistor may have a drain electrically connected to the gate of the first group III nitride transistor, a gate electrically connected to a cathode of the first diode and to a cathode of the second diode, and a source electrically connected to the source of the first group III nitride transistor.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The silicon-based Metal-Oxide-Semiconductor Field-Effect Transistor (MOSFET) is sensitive to an electrostatic discharge (ESD) surge event. The ESD surge event may accumulate electrons on an interelectrode capacitance (e.g., parasitic capacitor), for example, a gate-to-source capacitance, and may then induce a high electrical potential thereon. Subsequently, the ESD surge event may cause electrostatic breakdown of the gate oxide. Advantageously, the silicon-based MOSFET has a body diode to protect the silicon-based MOSFET from electrostatic breakdown by releasing accumulated electrons or a sizeable instant current induced by the ESD surge event.

Development of silicon-based MOSFETs, particularly for power devices, has resulted in performance close to the theoretical limit as determined by the nature of material. A better alternative to the silicon-based MOSFET may be a III-V compound-based transistor. The III-V compound-based transistor, with relatively high breakdown voltage and low on-resistance accompanied with relatively small device size has gained popularity. The III-V compound-based transistor offers relatively fast switching speed and superior reverse-recovery performance. Unlike the silicon-based MOSFET, the III-V compound-based transistor conducts through a lateral two-dimensional electron gas (2DEG) channel formed by the polarization effect. The III-V compound-based transistor is innately free from a body diode and has a relatively low stray input/output capacitance. The III-V compound-based transistor has relatively poor resilience to the ESD surge event. Hence, a well-designed ESD protection circuit is required to protect the III-V compound-based transistor from the ESD surge event.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (InAlAs), and others.

Figure 1:
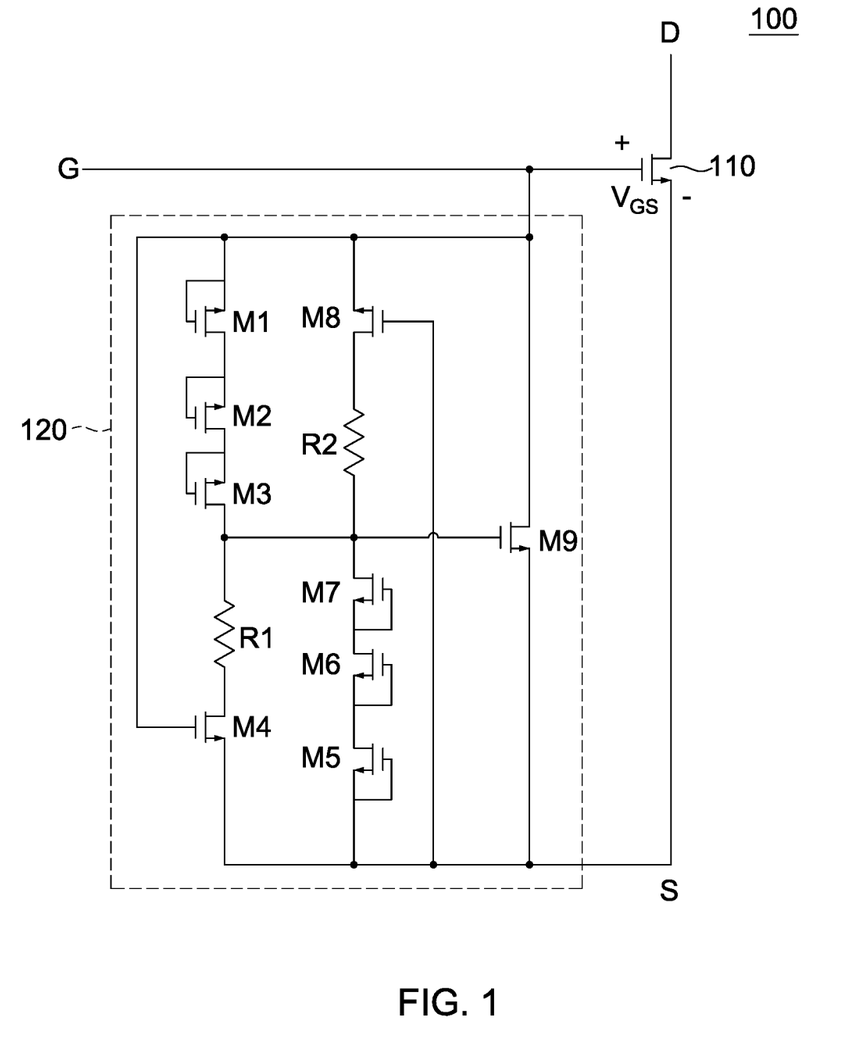
FIG. 1 illustrates a schematic diagram of an electronic device, in accordance with some embodiments of the present disclosure.

FIG. 1 illustrates a schematic diagram of an electronic device 100, in accordance with some embodiments of the present disclosure. The electronic device 100 can include a transistor 110 and an ESD protection circuit 120.

The transistor 110 may be formed of or include a direct bandgap material, such as an III-V compound, which includes but is not limited to, for example, GaAs, InP, GaN, InGaAs and AlGaAs. The transistor 110 may be a GaN-based transistor. The transistor 110 can include a high-electron-mobility transistor (HEMT). The transistor 110 may be a power device (e.g., a power transistor) or a part of a power device.

The transistor 110 may have a gate (G), a drain (D) and a source (S). The transistor 110 may be or include a "normally-off" type of transistor. For example, in operation, if a gate-source voltage (i.e., $V_{GS}$) applied across the gate and the source of the transistor 110 equals or exceeds a threshold voltage ($V_{TH}$) of the transistor 110, the transistor 110 can be turned on to contact a current (e.g., from the drain to the source). If the gate-source voltage (i.e., $V_{GS}$) applied across the gate and the source of the transistor 110 is less than the threshold voltage ($V_{TH}$) of the transistor 110, the transistor 110 would be turned off. In other embodiments, the transistor 100 may be or include a "normally-on" type of transistor depending on different design specifications.

The transistor 110 may include a GaN-based HEMT, which has a relatively low gate breakdown voltage, resulting in its gate terminal being susceptible to damage due to voltage overshoot spikes that exceed the gate breakdown voltage. Accordingly, the ESD protection circuit 120 can be connected between the gate of the transistor 110 and the source of the transistor 110 to protect the transistor 110 from overshoot voltage spikes during device switching or an ESD surge event. The ESD protection circuit 120 may be connected between the gate of the transistor 110 and the drain of the transistor 110. The ESD protection circuit 120 may be connected between the drain of the transistor 110 and the source of the transistor 110.

The ESD protection circuit 120 and the transistor 110 may be integrated within an integrated circuit (IC) chip. Alternatively, the ESD protection circuit 120 and the transistor 110 may be discretely disposed on a circuit board (e.g., a printed circuit board (PCB) or a motherboard) and electrically connected to each other at the packaging level and/or the circuit board level.

The ESD protection circuit 120 includes transistors M1, M2, M3, M4, M5, M6, M7, M8, M9 and resistors R1 and R2. The transistors M1, M2, M3, M4, M5, M6, M7, M8, M9 can include GaN-based transistors. The transistors M1, M2, M3, M4, M5, M6, M7, M8, M9 can include HEMTs.

Each of the transistors M1, M2, M3, M4, M5, M6, M7, M8, M9 has a gate, a drain and a source. The gate and the source of each of the transistors M1, M2, M3, M5, M6, M7 may be connected to each other. For example, the transistors M1, M2, M3, M5, M6, M7 may be diode-connected transistors, which may function as diodes.

The transistors M1, M2, M3 may be connected in series. For example, the gate and the source of the transistor M2 may be connected to the drain of the transistor M1, and the gate and the source of the transistor M3 may be connected to the drain of the transistor M2. There may be any number of diode-connected transistors connected in series between the drain and the gate of the transistor M9, although FIG. 1 illustrates three diode-connected transistors connected in series. For example, there may be N diode-connected transistors connected in series between the drain and the gate of the transistor M9, where N is an integer equal to or greater than 1.

The transistors M5, M6, M7 may be connected in series. For example, the gate and the source of the transistor M6 may be connected to the drain of the transistor M5, and the gate and the source of the transistor M7 may be connected to the drain of the transistor M6. There may be any number of diode-connected transistors connected in series between the gate and the source of the transistor M9, although FIG. 1 illustrates three diode-connected transistors connected in series. For example, there may be N diode-connected transistors connected in series between the gate and the source of the transistor M9, where N is an integer equal to or greater than 1.

The source and the gate of the transistor M1 may be connected to the gate of the transistor 110. The source and the gate of the transistor M1 may be connected to the gate of the transistor M4. The source and the gate of the transistor M1 may be connected to the source of the transistor M8. The source and the gate of the transistor M1 may be connected to the drain of the transistor M9. The drain of the transistor M3 may be connected to the gate of the transistor M9. The drain of the transistor M3 may be connected to the drain of the transistor M7. The drain of the transistor M3 may be connected to the resistor R1. The drain of the transistor M3 may be connected to the resistor R2. The drain of the transistor M4 may be connected to the resistor R1. The gate of the transistor M4 may be connected to the gate of the transistor 110. The source of the transistor M4 may be connected to the source of the transistor 110.

The source and the gate of the transistor M5 may be connected to the source of the transistor 110. The source and the gate of the transistor M5 may be connected to the gate of the transistor M8. The source and the gate of the transistor M5 may be connected to the source of the transistor M4. The source and the gate of the transistor M5 may be connected to the source of the transistor M9. The drain of the transistor M7 may be connected to the gate of the transistor M9. The drain of the transistor M7 may be connected to the resistor R1. The drain of the transistor M7 may be connected to the resistor R2. The drain of the transistor M8 may be connected to the resistor R2. The gate of the transistor M8 may be connected to the source of the transistor 110. The source of the transistor M8 may be connected to the gate of the transistor 110. The drain of the transistor M9 may be connected to the gate of the transistor 110. The source of the transistor M9 may be connected to the source of the transistor 110. The resistor R1 may be connected between the gate of the transistor M9 and the drain of the transistor M4. The resistor R2 may be connected between the gate of the transistor M9 and the drain of the transistor M8.

The transistors M1, M2, M3, M4, M5, M6, M7, M8, and M9 may have the same threshold voltage ($V_{TH}$), or, alternatively, different threshold voltages (e.g., $V_{TH1}$, $V_{TH2}$, $V_{TH3}$, $V_{TH4}$, $V_{TH5}$, $V_{TH6}$, $V_{TH7}$, $V_{TH8}$, and $V_{TH9}$) depending on differing design specifications. The transistors M1, M2, and M3 may have the same or different aspect ratios (e.g., a ratio of width to length), depending on differing design specifications. The transistors M1, M2, and M3 may have different widths. An aspect ratio of the transistor M9 may exceed the aspect ratio of each of transistors M1, M2, and M3. The transistor M9 and the transistors M1, M2, and M3 may be of the same length, but the transistor M9 may be wider, allowing it to carry or discharge a larger current than the transistors M1, M2, M3. The transistors M5, M6, and M7 may have the same or different aspect ratios, depending on differing design specifications. The transistors M5, M6, M7 may have different widths. An aspect ratio of the transistor M9 may exceed that of each of the transistors M5, M6, and M7. The transistor M9 and the transistors M5, M6, and M7 may have the same length, but the transistor M9 may be wider, allowing it to carry or discharge a larger current than each of the transistors M5, M6, M7.

The transistor M4 and the transistor 110 may have the same or different threshold voltages. The transistor M8 and the transistor 110 may have the same or different threshold voltages. The source and the drain of a GaN-based transistor can be exchanged, such that the drain of each of the transistors M1, M2, M3, M4, M5, M6, M7, M8, and M9 and the source of the transistors M1, M2, M3, M4, M5, M6, M7, M8, and M9 can be exchanged.

The ESD protection circuit 120 can be configured to protect the transistor 110 from ESD events. In operation, when the gate-source voltage ($V_{GS}$) across the gate and the source of the transistor 110 is less than a first predetermined value, the ESD protection circuit 120 is not triggered (disabled). The current may drain or flow through the transistor 110. Hence, the ESD protection circuit 110 does not affect normal work or performance of the transistor 110. For example, the transistor 110 is in a normal work mode. The first predetermined value may be equal to a sum of the threshold voltages of the transistors M1, M2, M3, and M9 (e.g., $4V_{TH}$ or $V_{TH1}+V_{TH2}+V_{TH3}+V_{TH9}$).

In normal work mode of the transistor 110, the transistor M4 may be turned off if the gate-source voltage ($V_{GS}$) falls below the threshold voltage (e.g., $V_{TH4}$) of the transistor M4. The parallel connection between the gate-to-source resistance ($R_{GS}$) of the transistor 110 and the relatively small series resistance of the transistors M1, M2, M3, and the resistor R1 may be disconnected. Hence, the equivalent resistance at the gate of the transistor 110 may equal the gate-to-source resistance ($R_{GS}$). The transistor M4 may help limit the gate leakage current through the transistors M1, M2, and M3, and the resistor R1 to the source of the transistor 110. The transistor M4 may reduce leakage current through the ESD protection circuit 110.

Similarly, when a source-gate voltage ($V_{SG}$) applied across the source and gate of the transistor 110 is less than a second predetermined value, the ESD protection circuit 120 is not triggered (or disabled). The current may drain or flow through the transistor 110. The second predetermined value may equal a sum of the threshold voltages of the transistors M5, M6, M7, and M9 (e.g., $4V_{TH}$ or $V_{TH5}+V_{TH6}+V_{TH7}+V_{TH9}$). Hence, the ESD protection circuit 120 does not affect normal work or performance of the transistor 110. For example, the transistor 110 is in a normal work mode.

In a normal work mode of the transistor 110, the transistor M8 may be turned off if the source-gate voltage ($V_{SG}$) falls below the threshold voltage (e.g., $V_{TH8}$) of the transistor M8. The parallel connection between the gate-to-source resistance ($R_{GS}$) of the transistor 110 and the relatively low series resistance of the transistors M5, M6, and M7, and the resistor R2 may be disconnected. Hence, the equivalent resistance at the gate of the transistor 110 may equal the gate-to-source resistance ($R_{GS}$). The transistor M8 may help limit the gate leakage current through the transistors M5, M6, and M7, and the resistor R2 to the source of the transistor 110. In normal work mode of the transistor 110, the transistor M8 may reduce leakage current through the ESD protection circuit 110.

The resistor R1 may be configured to connect the gate of the transistor M9 to the source of the transistor M9. The charge stored in the gate of the transistor M9 may be drained through the resistor R1 when the transistor M9 is turned off. Thus, the resistor R1 may be configured to prevent the gate of the transistor M9 from electrically floating when the transistor M9 is turned off. Furthermore, the resistor R1 may be configured to prevent the gate of the transistor M9 from any parasitic coupling or being affected by noise.

The resistor R2 may be configured to connect the gate of the transistor M9 to the drain of the transistor M9. The charge stored in the gate of the transistor M9 may be drained through the resistor R2 when the transistor M9 is turned off. Thus, the resistor R2 may be configured to prevent the gate of the transistor M9 from electrically floating when the transistor M9 is turned off. Furthermore, the resistor R2 may be configured to prevent the gate of the transistor M9 from any parasitic coupling or being affected by noise.

Figure 2:
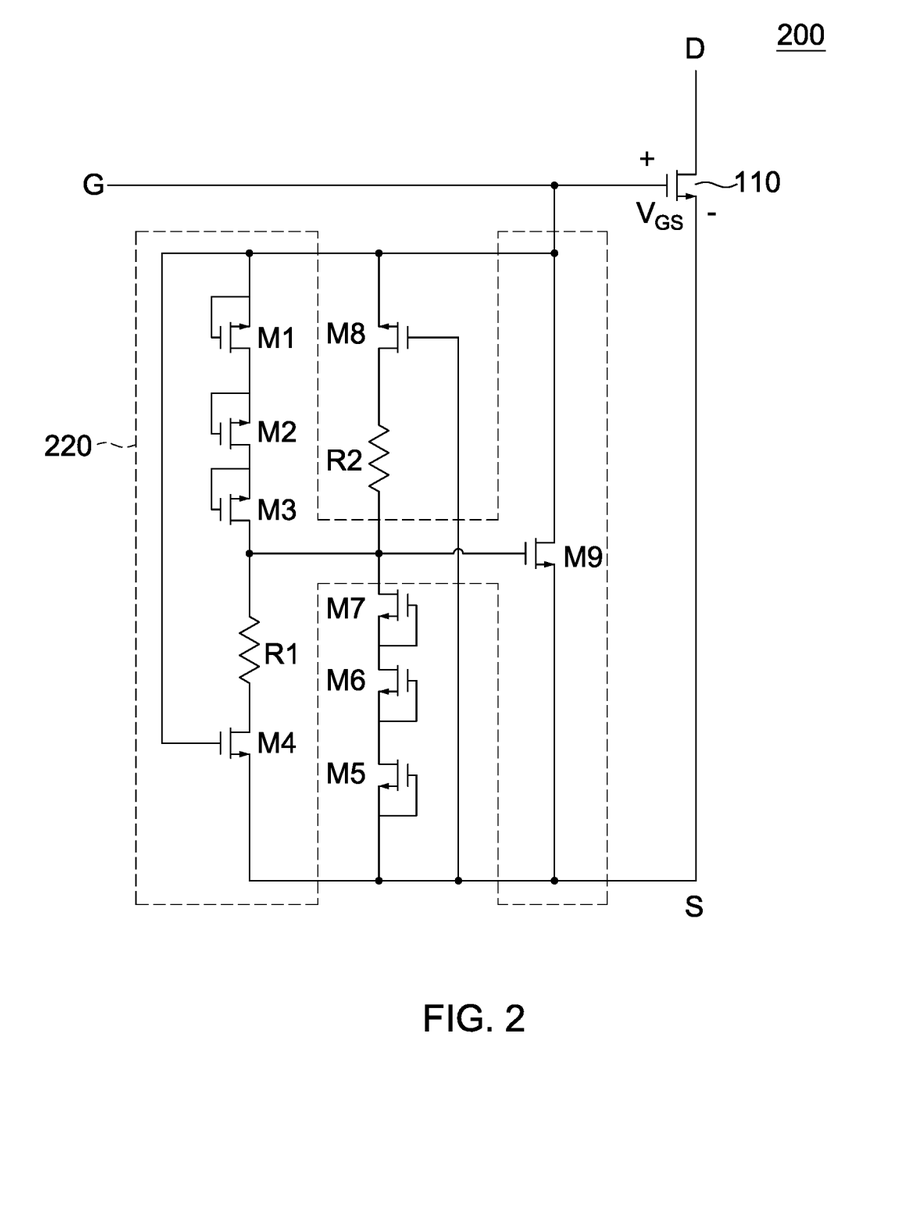
FIG. 2 illustrates an equivalent circuit of the electronic device as shown in FIG. 1, in accordance with some embodiments of the present disclosure.

FIG. 2 illustrates an equivalent circuit of the electronic device 100 as shown in FIG. 1 when the transistor 110 experiences a positive ESD, in accordance with some embodiments of the present disclosure. The transistor 110 which experiences the positive ESD may represent that the gate-source voltage ($V_{GS}$) applied across the gate and the source of the transistor 110 equals or exceeds a predetermined value (e.g., $V_{GS} \geq 4V_{TH}$ or $V_{GS} \geq V_{TH1}+V_{TH2}+V_{TH3}+V_{TH9}$).

As shown in FIG. 2, when the gate-source voltage ($V_{GS}$) applied across the gate and the source of the transistor 110 equals or exceeds the predetermined value, the ESD projection circuit 120 is triggered (or enabled). The gate-source voltage ($V_{GS}$) applied across the gate and the source of the transistor 110 would turn on a portion of the electronic components (e.g., the transistors M1, M2, M3, M4) of the ESD projection circuit 120 encircled by a dotted-line frame. Meanwhile, the transistors M5, M6, M7, and M8 may be turned off.

A voltage (e.g., $V_{GS}-3V_{TH}$ or $V_{GS}-(V_{TH1}+V_{TH2}+V_{TH3})$) may then be applied across the gate and the source of the transistor M9 to turn on the transistor M9. The accumulated charge at the gate of the transistor 110 is discharged or drained through the transistors M1, M2, and M3 and the transistor M9 to prevent damage from the accumulated charge or voltage applied to the gate of the transistor 110.

Figure 3:
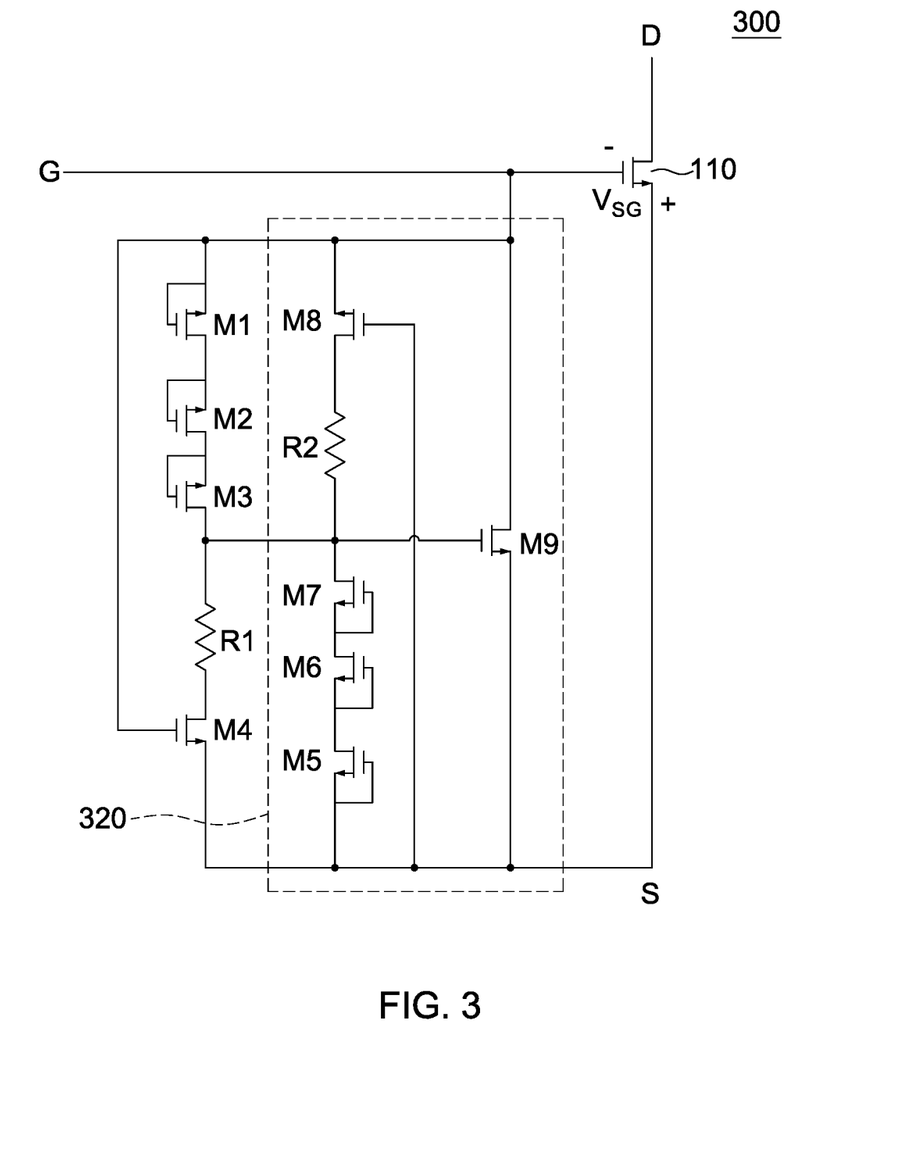
FIG. 3 illustrates an equivalent circuit of the electronic device as shown in FIG. 1, in accordance with some embodiments of the present disclosure.

FIG. 3 illustrates an equivalent circuit of the electronic device 100 as shown in FIG. 1 when the transistor 110 experiences a negative ESD, in accordance with some embodiments of the present disclosure. The transistor 110 which experiences the negative ESD may represent that a source-gate voltage ($V_{SG}$) applied across the source and the gate of the transistor 110 equals or exceeds a predetermined value (e.g., $V_{SG} \geq 4V_{TH}$ or $V_{SG} \geq V_{TH5}+V_{TH6}+V_{TH7}+V_{TH9}$).

As shown in FIG. 3, when the source-gate voltage ($V_{SG}$) applied across the source and the gate of the transistor 110 equals or exceeds the predetermined value (e.g., $V_{SG} \geq 4V_{TH}$ or $V_{SG} \geq V_{TH5}+V_{TH6}+V_{TH7}+V_{TH9}$), the ESD protection circuit 120 is triggered (or enabled). The source-gate voltage ($V_{SG}$) applied across the source and the gate of the transistor 110 would turn on a portion of the electronic components (e.g., the transistors M5, M6, M7, and M8) of the ESD projection 120 encircled by a dotted-line frame. Meanwhile, the transistors M1, M2, M3, and M4 may be turned off.

A voltage (e.g., $V_{SG}-3V_{TH}$ or $V_{SG}-(V_{TH5}+V_{TH6}+V_{TH7})$) may then be applied across the gate and the drain of the transistor M9. As previously described, the drain and the source of the transistor M9 can be exchanged. Thus, the voltage (e.g., $V_{SG}-3V_{TH}$ or $V_{SG}-(V_{TH5}+V_{TH6}+V_{TH7})$) applied across the gate and the drain (i.e., the source) of the transistor M9 may turn on the transistor M9. The accumulated charge at the source of the transistor 110 may be discharged or drained through the transistors M5, M6, M7 and the transistor M9 to prevent damage from the accumulated charge or voltage applied to the gate of the transistor 110.

In accordance with the embodiments as shown in FIG. 1, FIG. 2, and FIG. 3, either positive ESD or negative ESD at the gate of the transistor 110 can trigger the ESD protection circuit 120, providing enhanced ESD protection. Trigger voltage of the ESD projection circuit 120 can be determined by choosing the threshold voltages of the transistors M1, M2, M3, M5, M6, M7, and M9, increasing flexibility for ESD projection circuit 120 design. The ESD projection circuit 120 may have the same trigger voltage for positive and negative ESD protection if the sum of threshold voltages of the transistors M1, M2, M3, and M9 (e.g., $V_{TH1}+V_{TH2}+V_{TH3}+V_{TH9}$) equals the sum of threshold voltages of the transistors M5, M6, M7, and M9 (e.g., $V_{TH5}+V_{TH6}+V_{TH7}+V_{TH9}$).

Figure 4:
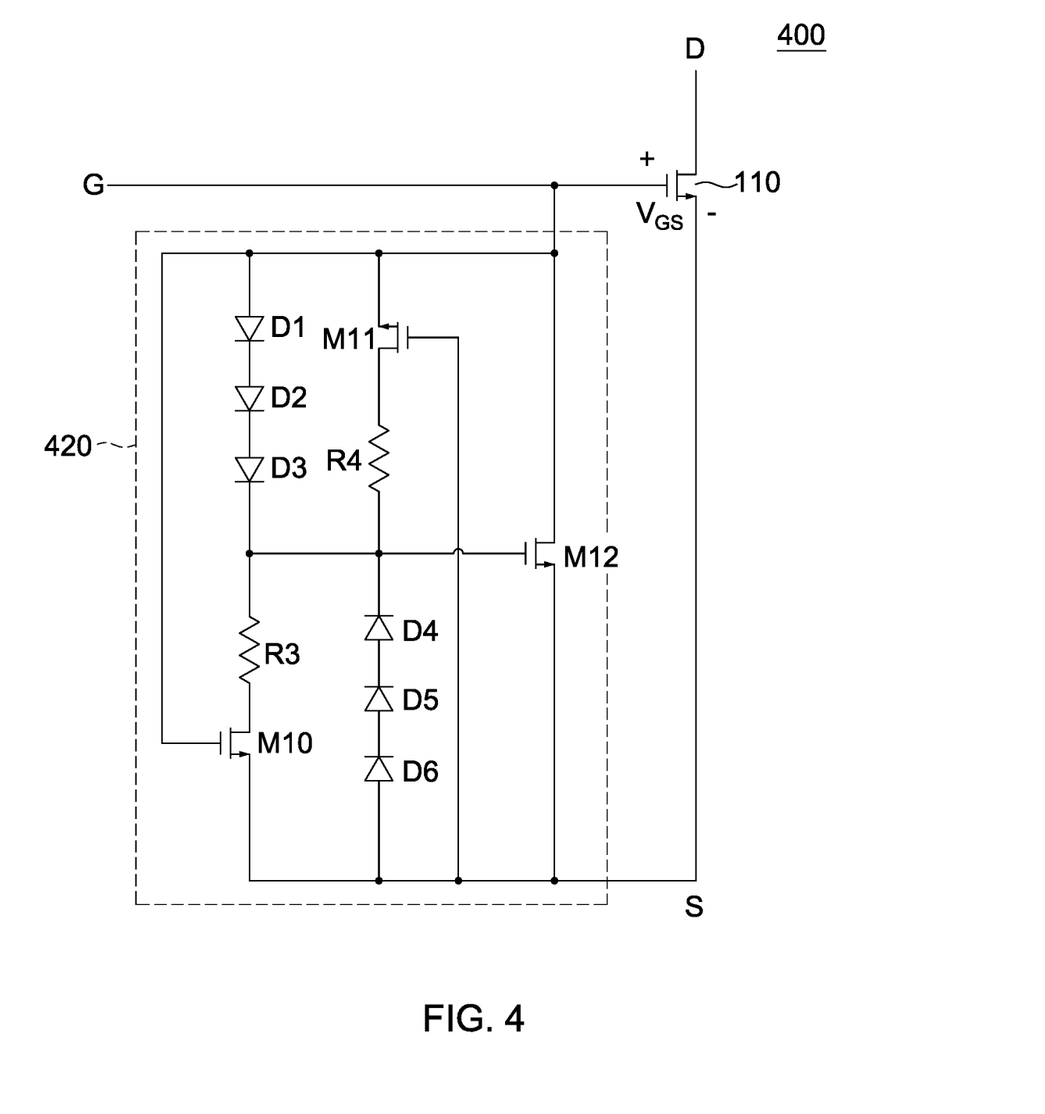
FIG. 4 illustrates a schematic diagram of an electronic device, in accordance with some embodiments of the present disclosure.

FIG. 4 illustrates a schematic diagram of an electronic device 200, in accordance with some embodiments of the present disclosure. The electronic device 200 can include the transistor 110 and an ESD protection circuit 220. The ESD protection circuit 220 is similar to the ESD protection circuit 120 as shown in FIG. 1, and some of the differences therebetween are described below.

The ESD protection circuit 220 may be connected between the gate (G) of the transistor 110 and the source (S) of the transistor 110. The ESD protection circuit 220 may be connected between the gate of the transistor 110 and the drain (D) of the transistor 110. The ESD protection circuit 220 may be connected between the drain of the transistor 110 and the source of the transistor 110. The ESD protection circuit 220 and the transistor 110 may be integrated within an IC chip. The ESD protection circuit 220 may be integrated and fabricated together with the GaN-based transistor 110, which may reduce parasitic inductance and parasitic capacitance.

The ESD protection circuit 220 can include diodes D1, D2, D3, D4, D5, D6, transistors M10, M11, M12, and resistors R3 and R4. The transistors M10, M11, M12 may include GaN-based transistors. The transistors M10, M11, M12 may include HEMTs. The diodes D1, D2, D3, D4, D5, D6 can include Schottky barrier diodes (SBDs). The D1, D2, D3, D4, D5, D6 can include GaN-based SBDs. The diodes D1, D2, D3, D4, D5, D6 may have the same size. Alternatively, the diodes D1, D2, D3, D4, D5, D6 may have difference sizes depending on different design specifications.

As shown in FIG. 4, the diodes D1, D2, D3 may be connected in series. For example, a cathode of the diode D1 may be connected to an anode of the diode D2, a cathode of the diode D2 may be connected to an anode of the diode D3. The diodes D4, D5, D6 may be connected in series. For example, a cathode of the diode D6 may be connected to an anode of the diode D5, and a cathode of the diode D5 may be connected to an anode of the diode D4. There may be any number of diodes connected in series between the drain and the gate of the transistor M12 or the gate and the source of the transistor M12, although FIG. 4 illustrates three diodes connected in series. For example, there may be N diodes connected in series between the drain and the gate of the transistor M12 or the gate and the source of the transistor M12, where N is an integer equal to or greater than 1.

The anode of the diode D1 may be connected to the gate of the transistor 110. The anode of the diode D1 may be connected to a gate of the transistor M10. The anode of the diode D1 may be connected to a source of the transistor M11. The anode of the diode D1 may be connected to a drain of the transistor M12. The cathode of the diode D3 may be connected to the gate of the transistor M12. The cathode of the diode D3 may be connected to the cathode of the diode D4. The cathode of the diode D3 may be connected to the resistor R3. The cathode of the diode D3 may be connected to the resistor R4. The drain of the transistor M10 may be connected to the resistor R3. The gate of the transistor M10 may be connected to the gate of the transistor 110. The source of the transistor M10 may be connected to the source of the transistor 110. The anode of the diode D6 may be connected to the source of the transistor 110. The anode of the diode D6 may be connected to a source of the transistor M10. The anode of the diode D6 may be connected to a gate of the transistor M11. The anode of the diode D6 may be connected to a source of the transistor M12. The cathode of the diode D4 may be connected to the gate of the transistor M12. The cathode of the diode D4 may be connected to the resistor R3. The cathode of the diode D4 may be connected to the resistor R4. The drain of the transistor M11 may be connected to the resistor R4. The gate of the transistor M11 may be connected to the source of the transistor 110. The source of the transistor M11 may be connected to the gate of the transistor 110. The drain of the transistor M12 may be connected to the gate of the transistor 110. The source of the transistor M12 may be connected to the source of the transistor 110. The resistor R3 may be connected between the gate of the transistor M12 and the drain of the transistor M10. The resistor R4 may be connected between the gate of the transistor M12 and the drain of the transistor M11.

The diodes D1, D2, D3, D4, D5, D6 may have the same threshold voltage ($V_{DTH}$). Alternatively, the diodes D1, D2, D3, D4, D5, D6 may include different threshold voltages (e.g., $V_{DTH1}$, $V_{DTH2}$, $V_{DTH3}$, $V_{DTH4}$, $V_{DTH5}$, $V_{DTH6}$) depending on different design specifications.

The transistor M10 and the transistor 110 may have the same or different threshold voltages. The transistor M11 and the transistor 110 may have the same or different threshold voltages. The source and the drain of a GaN-based transistor can be exchanged, such that the drain of transistors M10, M11, and M12 and the source of the transistor M10, M11, and M12 can be exchanged.

The ESD protection circuit 220 can be configured to protect the transistor 110 from ESD events. In operation, when a gate-source voltage ($V_{GS}$) applied across the gate and the source of the transistor 110 is less than a third predetermined value, the ESD protection circuit 220 is not triggered (or is disabled). The current drains or flows through the transistor 110. Hence, the ESD protection circuit 220 does not affect normal work or performance of the transistor 110. For example, the transistor 110 is in a normal work mode. The third predetermined value may equal a sum of the threshold voltages of the diodes D1, D2, D3, and the threshold voltage of the transistor M12 (e.g., $3V_{DTH}+V_{TH12}$ or $V_{DTH1}+V_{DTH2}+V_{DTH3}+V_{TH12}$).

In normal work mode of the transistor 110, the transistor M10 may be turned off if the gate-source voltage ($V_{GS}$) falls below the threshold voltage (e.g., $V_{TH10}$) of the transistor M10. The parallel connection between the gate-to-source resistance ($R_{GS}$) of the transistor 110 and the relatively small series resistance of the diodes D1, D2, D3, and the resistor R3 may be disconnected. Hence, the equivalent resistance at the gate of the transistor 110 may equal the gate-to-source resistance ($R_{GS}$). The transistor M10 may help limit the gate leakage current through the diodes D1, D2, D3, and the resistor R3 to the source of the transistor 110. The transistor M10 may reduce leakage current through the ESD protection circuit 110.

Similarly, when a source-gate voltage ($V_{SG}$) applied across the source and the gate of the transistor 110 is less than a fourth predetermined value, the ESD protection circuit 220 is not triggered (or disabled). The current may drain or flow through the transistor 110. Hence, the ESD protection circuit 220 does not affect normal work or performance of the transistor 110 (in normal work mode). The fourth predetermined value may equal a sum of the threshold voltages of the diodes D4, D5, and D6, and the threshold voltage of the transistor M12 (e.g., $3V_{DTH}+V_{TH12}$ or $V_{DTH4}+V_{DTH5}+V_{DTH6}+V_{TH12}$).

In a normal work mode of the transistor 110, the transistor M11 may be turned off if the source-gate voltage ($V_{SG}$) falls below the threshold voltage (e.g., $V_{TH11}$) of the transistor M11. The parallel connection between the gate-to-source resistance ($R_{GS}$) of the transistor 110 and the relatively low series resistance of the diodes D4, D5, D6, and the resistor R4 may be disconnected. Hence, the equivalent resistance at the gate of the transistor 110 may equal the gate-to-source resistance ($R_{GS}$). The transistor M11 may help limit the gate leakage current through the diodes D4, D5, D6, and the resistor R4 to the source of the transistor 110. In normal work mode of the transistor 110, the transistor M11 may reduce leakage current through the ESD protection circuit 110.

The resistor R3 may be configured to connect the gate of the transistor M12 to the source of the transistor M12. The charge stored in the gate of the transistor M12 may be drained through the resistor R3 when the transistor M12 is turned off. Therefore, the resistor R3 may be configured to prevent the gate of the transistor M12 from electrically floating when the transistor M12 is turned off. Furthermore, the resistor R3 may be configured to prevent the gate of the transistor M12 from any parasitic coupling or being affected by noise.

The resistor R4 may be configured to connect the gate of the transistor M12 to the drain of the transistor M12. The charge stored in the gate of the transistor M12 may be drained through the resistor R4 when the transistor M12 is turned off. Therefore, the resistor R4 may be configured to prevent the gate of the transistor M12 from electrically floating when the transistor M12 is turned off. Furthermore, the resistor R4 may be configured to prevent the gate of the transistor M12 from any parasitic coupling or being affected by noise.

Figure 5:
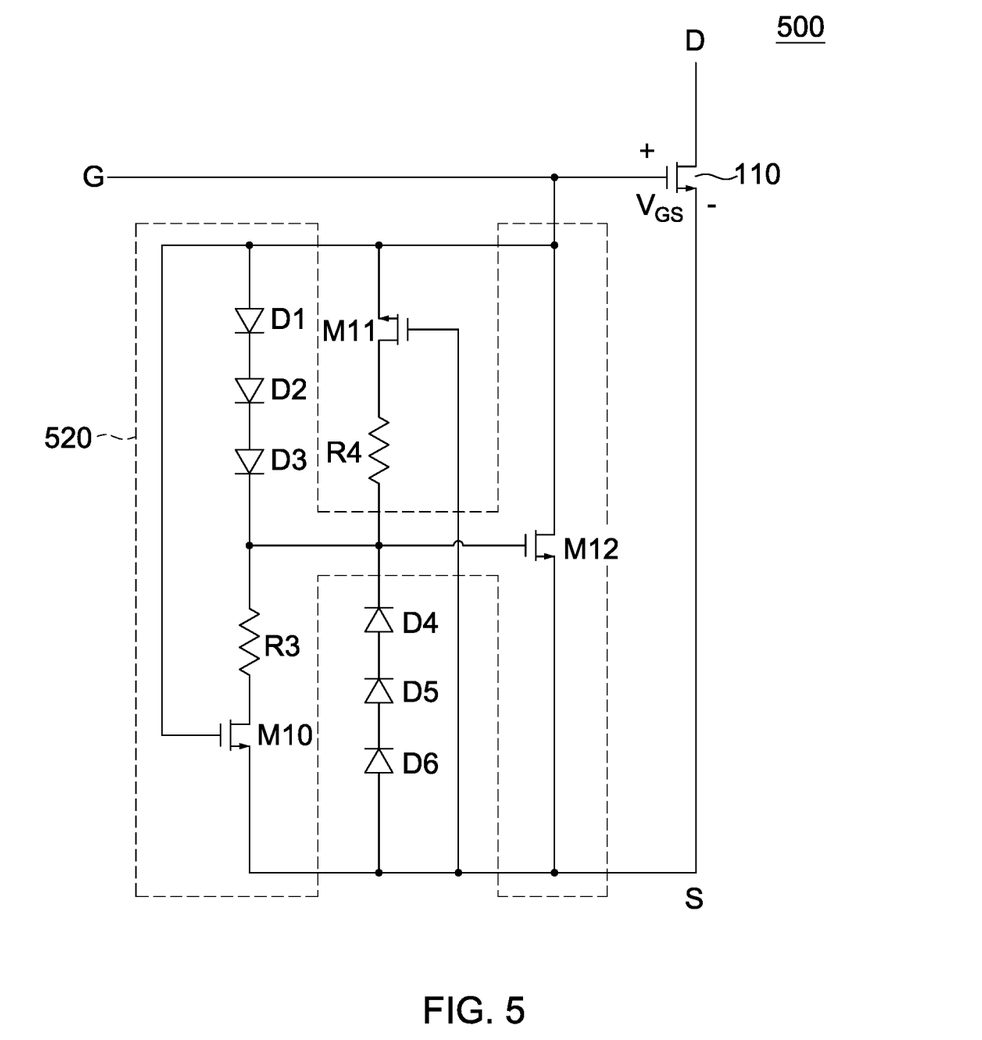
FIG. 5 illustrates an equivalent circuit of the electronic device as shown in FIG. 4, in accordance with some embodiments of the present disclosure.

FIG. 5 illustrates an equivalent circuit of the electronic device 200 as shown in FIG. 4, when the transistor 110 experiences a positive ESD, in accordance with some embodiments of the present disclosure. The transistor 110 experiences the positive ESD may represent that a gate-source voltage ($V_{GS}$) applied across the gate and the source of the transistor 110 equals or exceeds a predetermined value (e.g., $V_{GS}\geq 3V_{DTH}+V_{TH12}$ or $V_{GS}\geq V_{DTH1}+V_{DTH2}+V_{DTH3}+V_{TH12}$).

As shown in FIG. 5, when the gate-source voltage ($V_{GS}$) applied across the gate and the source of the transistor 110 equals or exceeds the predetermined value (e.g., $V_{GS}\geq 3V_{DTH}+V_{TH12}$ or $V_{GS}\geq V_{DTH1}+V_{DTH2}+V_{DTH3}+V_{TH12}$), the ESD protection circuit 120 is triggered (or enabled). The gate-source voltage ($V_{GS}$) applied across the gate and the source of the transistor 110 would turn on a portion of the electronic components (e.g., the diodes D1, D2, D3, and the transistors M10) of the ESD projection circuit 220 encircled by a dotted-line frame. Meanwhile, the diodes D4, D5, and D6 and the transistor M11 may be turned off.

A voltage (e.g., $V_{GS}-3V_{DTH}$ or $V_{GS}-(V_{DTH1}+V_{DTH2}+V_{DTH3})$) may then be then applied across the gate and the source of the transistor M12 to turn on the transistor M12. The accumulated charge at the gate of the transistor 110 is discharged or drained through the diodes D1, D2, D3 and the transistor M12 to prevent damage from the accumulated charge or voltage applied to the gate of the transistor 110.

Figure 6:
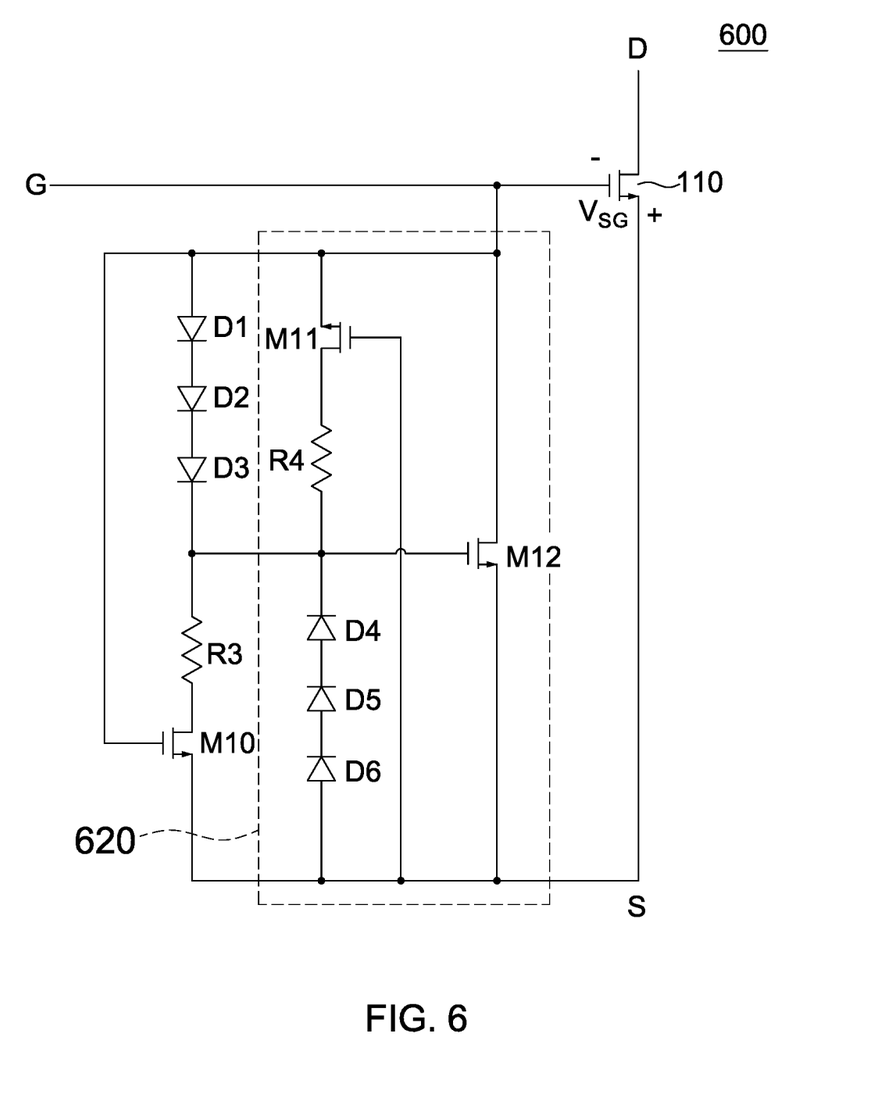
FIG. 6 illustrates an equivalent circuit of the electronic device as shown in FIG. 4, in accordance with some embodiments of the present disclosure.

FIG. 6 illustrates an equivalent circuit of the electronic device 200 as shown in FIG. 4, when the transistor 110 experiences a negative ESD, in accordance with some embodiments of the present disclosure. The transistor 110 experiences the negative ESD may represent that a source-gate voltage ($V_{SG}$) applied across the source and the gate of the transistor 110 equals or exceeds a predetermined value (e.g., $V_{SG}\geq 3V_{DTH}+V_{TH12}$ or $V_{SG}\geq V_{DTH4}+V_{DTH5}+V_{DTH6}+V_{TH12}$).

As shown in FIG. 6, when the source-gate voltage ($V_{SG}$) applied across the source and the gate of the transistor 110 equals or exceeds the predetermined value (e.g., $V_{SG}\geq 3V_{DTH}+V_{TH12}$ or $V_{SG}\geq V_{DTH4}+V_{DTH5}+V_{DTH6}+V_{TH12}$), the ESD protection circuit 120 is triggered (or enabled). The source-gate voltage ($V_{SG}$) applied across the source and the gate of the transistor 110 would turn on a portion of the electronic components (e.g., the diodes D4, D5, D6, and M11) of the ESD projection 220 encircled by a dotted-line frame. Meanwhile, the diodes D1, D2, and D3 and the transistor M10 may be turned off.

A voltage (e.g., $V_{SG}-3V_{DTH}$ or $V_{SG}-V_{DTH4}+V_{DTH5}+V_{DTH6}$) may then be applied across the gate the drain of the transistor M12. As previously described, the drain and the source of the transistor M12 can be exchanged. Hence, the voltage (e.g., $V_{SG}-3V_{DTH}$ or $V_{SG}-V_{DTH4}+V_{DTH5}+V_{DTH6}$) applied across the gate and the drain (i.e., the source) of the transistor M12 may turn on the transistor M12. The accumulated charge at the source of the transistor 110 is discharged or drained through the diodes D4, D5, D6 and the transistor M12 to prevent damage from the accumulated charge or voltage applied to the gate of the transistor 110.

In accordance with the embodiments as shown in FIG. 4, FIG. 5, and FIG. 6, either positive ESD or negative ESD at the gate of the transistor 110 can trigger the ESD protection circuit 220, increasing flexibility for ESD protection circuit 220 design. The ESD projection circuit 220 may have the same trigger voltage for positive and negative ESD protection if the sum of threshold voltages of diodes D1, D2, D3, and the transistor M12 (e.g., $V_{DTH1}+V_{DTH2}+V_{DTH3}+V_{TH12}$) equals the sum of threshold voltages of the diodes D4, D5, D6, and the transistor M12 (e.g., $V_{DTH4}+V_{DTH5}+V_{DTH6}+V_{TH12}$).

Figure 7:
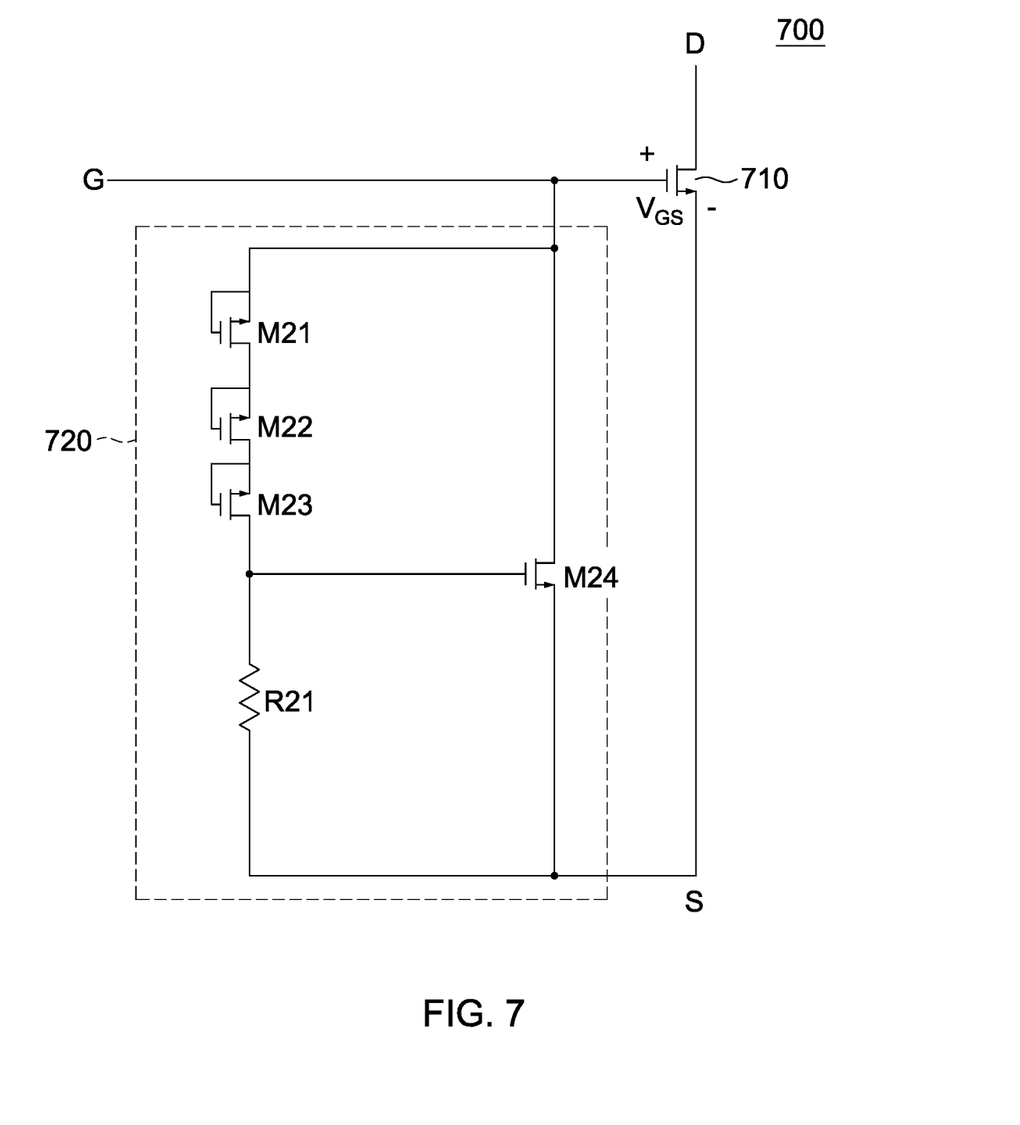
FIG. 7 illustrates a schematic diagram of an electronic device, in accordance with some embodiments of the present disclosure.

FIG. 7 illustrates a schematic diagram of an electronic device 300, in accordance with some embodiments of the present disclosure. The electronic device 300 can include a transistor 310 and an ESD protection circuit 320. The transistor 310 may be the same as or similar to the transistor 110 of the electronic device 100.

The ESD protection circuit 320 includes transistors M21, M22, M23, M24, and a resistor R21. The transistors M21, M22, M23, M24 can include GaN-based transistors. The transistors M21, M22, M23, M24 can include HEMTs.

Each of the transistors M21, M22, M23, M24 may have a gate, a drain and a source. The gate and the source of each of the transistors M21, M22, M23, M24 may be connected to each other. For example, the transistors M21, M22, M23 may be diode-connected transistors, which may act as diodes. The transistors M21, M22, M23 may be connected in series. For example, the gate and the source of the transistor M22 may be connected to the drain of the transistor M21, the gate and the source of the transistor M23 may be connected to the drain of the transistor M22. The source and the gate of the transistor M21 may be connected to the gate of the transistor 310 and the drain of the transistor M24. The drain of the transistor M23 may be connected to the gate of the transistor M24 and the resistor R21. The drain of the transistor M24 may be connected to the gate of the transistor 310. The source of the transistor M24 may be connected to the source of the transistor 310. The resistor R21 may be connected between the gate of the transistor M24 and the source of the transistor M24.

The transistors M21, M22, M23, M24 may have the same threshold voltage ($V_{TH}$). Alternatively, the transistors M21, M22, M23, M24 may include different threshold voltages (e.g., $V_{TH21}$, $V_{TH22}$, $V_{TH23}$, $V_{TH24}$) depending on different design specifications. The source and the drain of a GaN-based transistor can be exchanged, such that the drain of transistors M21, M22, and M23, M24 and the source of the transistor M21, M22, and M23, M24 can be exchanged.

The ESD protection circuit 320 can be configured to protect the transistor 310 from ESD events. In operation, when a gate-source voltage ($V_{GS}$) applied to the gate of the transistor 310 is less than a fifth predetermined value, the ESD protection circuit 320 is not triggered (or is disabled). Hence, the ESD protection circuit 320 does not affect normal work or performance of the transistor 310 (in normal work mode). The current may drain or flow through the transistor 310. The fifth predetermined value may be equal to a sum of the threshold voltages of the transistors M21, M22, M23, and M24 (e.g., $4V_{TH}$ or $V_{TH21}+V_{TH22}+V_{TH23}+V_{TH24}$).

The resistor R21 may be configured to connect the gate of the transistor M24 to the source of the transistor M24. The charge stored in the gate of the transistor M24 may be drained through the resistor R21 when the transistor M24 is turned off. Therefore, the resistor R21 may be configured to prevent the gate of the transistor M24 from electrically floating when the transistor M24 is turned off. Furthermore, the resistor R21 may be configured to prevent the gate of the transistor M24 from any parasitic coupling or being affected by noise.

However, in normal work mode of the transistor 310, the relatively small series resistance of diode-connected transistors M21, M22, and M23 and resistor R21 may be connected in parallel with the gate-to-source resistance ($R_{GS}$) of the transistor 310. The equivalent resistance at the gate of the transistor 310 may decrease, and, commensurately, the gate leakage current of the transistor 310 may increase. The gate leakage current may flow through transistors M21, M22, and M23 and the resistor R21 to the source of the transistor 710. In accordance with the embodiments as shown in FIG. 1, the transistor M4 may be turned off if the gate-source voltage ($V_{GS}$) falls below the threshold voltage (e.g., $V_{TH4}$) of the transistor M4. The parallel connection between the gate-to-source resistance ($R_{GS}$) of the transistor 110 and the relatively low series resistance of the transistors M1, M2, and M3, and the resistor R1 may be disconnected. The equivalent resistance at the gate of the transistor 110 of FIG. 1 may be relatively great. Hence, the gate leakage current of the transistor 110 can be reduced.

The transistor 310 may experience positive ESD. When the gate-source voltage ($V_{GS}$) applied to the gate of the transistor 310 equals or exceeds the predetermined value (e.g., $V_{GS} \geq 4V_{TH}$ or $V_{GS} \geq V_{TH21}+V_{TH22}+V_{TH23}+V_{TH24}$), the ESD protection circuit 320 is triggered (or enabled). For example, if the transistors M21, M22, M23 are turned on, and a voltage (e.g., $V_{GS}-3V_{TH}$ or $V_{GS}-(V_{TH21}+V_{TH22}+V_{TH23})$) is applied across the gate and the source of the transistor M24 to turn on the transistor M24, the accumulated charge at the gate of the transistor 310 is discharged or drained through the transistors M21, M22, and M23 and the transistor M24 to protect the transistor 310 from damage from the accumulated charge or the voltage applied to the gate of the transistor 310.

The transistor 310 may experience negative ESD. When the source-gate voltage ($V_{SG}$) applied to the gate of the transistor 310 equals or exceeds the predetermined value (e.g., $V_{SG} \geq V_{TH24}$), the ESD protection circuit 320 is triggered (or enabled). As previously described, the drain and the source of the transistor M24 can be exchanged. Hence, the voltage (e.g., $V_{SG}$) is applied across the gate and the source of the transistor M24 to turn on the transistor M24, and the accumulated charge at the source of the transistor 310 is discharged or drained through the transistor M24 to protect the transistor 310 from damage from the accumulated charge or the voltage applied to the gate of the transistor 310.

However, the trigger voltage (e.g., $V_{TH24}$) for the negative ESD protection of the ESD projection circuit 320 is different from the trigger voltage (e.g., $V_{TH21}+V_{TH22}+V_{TH23}+V_{TH24}$) for the positive ESD protection of the ESD projection circuit 320. The trigger voltage (e.g., $V_{TH24}$) for the negative ESD protection is relatively small, such that the ESD projection circuit 320 may affect the normal work or performance of the transistor 310. When the transistor 310 is applied with a moderate negative bias during normal operation, the ESD projection circuit 320 may be accidentally turned on to discharge or drain the charge at the source of the transistor 310. As such, the transistor 310 may be unable to work normally. In accordance with the embodiments as shown in FIG. 1, the ESD projection circuit 120 may have the same trigger voltage for positive and negative ESD protection. In accordance with the embodiments as shown in FIG. 4, the ESD projection circuit 220 may have the same trigger voltage for positive and negative ESD protection. The ESD projection circuit 120 in FIG. 1 and the ESD projection circuit 220 in FIG. 4 may have a relative great trigger voltage for negative ESD protection, that leaves room for the normal work or performance of the transistor 110.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first group III nitride transistor; and
   an electrostatic discharge (ESD) protection circuit comprising:
      a first transistor having a source and a gate connected to each other and electrically connected to a gate of the first group III nitride transistor;
      a second transistor having a source and a gate connected to each other and electrically connected to a source of the first group III nitride transistor; and
      a third transistor having a drain electrically connected to the gate of the first group III nitride transistor, a gate electrically connected to a drain of the first transistor and to a drain of the second transistor, and a source electrically connected to the source of the first group III nitride transistor; and
      a fourth transistor having a drain electrically connected to the gate of the third transistor, a gate electrically connected to the gate of the first group III nitride transistor, and a source electrically connected to the source of the first group III nitride transistor, wherein the first transistor is electrically connected between the gate and drain of the fourth transistor.

2. The electronic device of claim 1, wherein the ESD protection circuit further comprises:
   a first resistor connected between the gate of the third transistor and the drain of the fourth transistor.

3. The electronic device of claim 2, wherein the drain of the fourth transistor is electrically connected to a drain of the first transistor and wherein the fourth transistor is configured to disconnect the parallel connection between a gate-to-source resistance of the first group III nitride transistor and a series resistance of the first transistor and the first resistor.

4. The electronic device of claim 1, wherein the ESD protection circuit further comprises:
   a fifth transistor having a drain electrically connected to the gate of the third transistor, a gate electrically connected to the source of the first group III nitride transistor, and a source electrically connected to the gate of the first group III nitride transistor.

5. The electronic device of claim 4, wherein the ESD protection circuit further comprises:
   a second resistor connected between the gate of the third transistor and the drain of the fifth transistor.

6. The electronic device of claim 1, wherein the ESD protection circuit further comprises first N diode-connected transistors electrically connected in series and between the drain of the third transistor and the gate of the third transistor, where N is an integer equal to or greater than 1.

7. The electronic device of claim 6, wherein the ESD protection circuit is configured to drain a first current from the gate of the first group III nitride transistor if a gate-source voltage applied across the gate and the source of the first group III nitride transistor equals or exceeds a sum of threshold voltages of the first diode-connected transistors and a threshold voltage of the third transistor.

8. The electronic device of claim 6, wherein the ESD protection circuit further comprises second N diode-connected transistors electrically connected in series and between the source of the third transistor and the gate of the third transistor, where N is an integer equal to or greater than 1.

9. The electronic device of claim 8, wherein the ESD protection circuit is configured to drain a second current from the source of the first group III nitride transistor if a source-gate voltage applied across the source and the gate of the first group III nitride transistor equals or exceeds a sum of threshold voltages of the second diode-connected transistors and a threshold voltage of the third transistor.

10. The electronic device of claim 1, wherein the first transistor, the second transistor, and the third transistor include group III nitride transistors.

11. The electronic device of claim 1, wherein the first group III nitride transistor is a power device.

12. The electronic device of claim 1, wherein a sum of threshold voltages of the first transistor and the third transistor equals a sum of threshold voltages of the second transistor and the third transistor.

13. An electronic device, comprising:
a first group III nitride transistor; and
an ESD protection circuit comprising:
  a first diode having an anode electrically connected to a gate of the first group III nitride transistor;
  a second diode having an anode electrically connected to a source of the first group III nitride transistor;
  a first transistor having a drain electrically connected to the gate of the first group III nitride transistor, a gate electrically connected to a cathode of the first diode and to a cathode of the second diode, and a source electrically connected to the source of the first group III nitride transistor; and
  a second transistor having a drain electrically connected to the gate of the first transistor, a gate electrically connected to the gate of the first group III nitride transistor, and a source electrically connected to the source of the first group III nitride transistor, wherein the first diode is electrically connected between the gate and the drain of the second transistor.

14. The electronic device of claim 13, wherein the ESD protection circuit further comprises first N diodes electrically connected in series and between the drain of the first transistor and the gate of the first transistor, where N is an integer equal to or greater than 1.

15. The electronic device of claim 14, wherein the ESD protection circuit is configured to drain a first current from the gate of the first group III nitride transistor if a gate-source voltage applied across the gate and the source of the first group III nitride transistor equals or exceeds a sum of threshold voltages of the first diodes and a threshold voltage of the first transistor.

16. The electronic device of claim 15, wherein the ESD protection circuit is configured to drain a second current from the source of the first group III nitride transistor if a source-gate voltage applied across the source and the gate of the first group III nitride transistor equals or exceeds a sum of threshold voltages of the second diodes and a threshold voltage of the first transistor.

17. The electronic device of claim 14, wherein the ESD protection circuit further comprises second N diodes electrically connected in series and between the source of the first transistor and the gate of the first transistor, where N is an integer equal to or greater than 1.

18. The electronic device of claim 13, wherein a sum of threshold voltages of the first diode and the first transistor equals a sum of threshold voltages of the second diode and the first transistor.

* * * * *